United States Patent [19]

Godfrey et al.

[11] 4,146,852
[45] Mar. 27, 1979

[54] PHASE WEIGHTED ACOUSTIC REFLECTIVE ARRAY COMPRESSOR

[75] Inventors: James T. Godfrey, Columbia; Carl E. Nothnick, Pasadena; Robert A. Moore, Arnold, all of Md.

[73] Assignee: Westinghouse Electric Corp., Pittsburgh, Pa.

[21] Appl. No.: 834,077

[22] Filed: Sep. 19, 1977

[51] Int. Cl.² .................... H03H 9/26; H03H 9/32; H03H 9/04; H01L 41/10
[52] U.S. Cl. ................................. 333/195; 333/196; 333/153
[58] Field of Search .................... 333/30 R, 71, 72; 310/313

[56] References Cited

U.S. PATENT DOCUMENTS

| | | | |
|---|---|---|---|
| 3,931,598 | 1/1976 | Bongianni | 333/72 X |
| 4,055,820 | 10/1977 | Solie | 333/72 X |

Primary Examiner—Alfred E. Smith
Assistant Examiner—Marvin Nussbaum
Attorney, Agent, or Firm—H. W. Patterson

[57] ABSTRACT

An acoustic surface wave signal transmission device includes a medium having a surface suitable for propagating acoustic energy or waves and having a first impedance characteristic. The surface of the medium includes an array of periodic discontinuities of a second impedance characteristic. The widths of the discontinuities vary in a predetermined manner to reflect a portion of said acoustic energy in proportion to the widths of the discontinuities. A transmitting transducer on said surface converts an input electrical signal into corresponding acoustic energy or waves and launches the energy or waves on said medium toward said array of discontinuities. The acoustic energy is reflected from said array of discontinuities toward a receiving transducer which converts the reflected acoustic energy or waves into a corresponding electrical signal.

10 Claims, 11 Drawing Figures

PHASE WEIGHTED ACOUSTIC REFLECTIVE ARRAY COMPRESSOR

BACKGROUND OF THE INVENTION

1. Field of the Invention

This invention relates to electroacoustic apparatus, and more particularly, to surface acoustic wave reflection mode devices.

2. Description of the Prior Art

The use of acoustic reflective array compressors (RAC) for pulse compression and expansion, as well as for filters, is well known in the electrical arts. A typical RAC implementation consists of dispersive reflective grooves or gratings oriented to reflect an acoustic beam launched by an input transducer to an output transducer. The theory and operation of such an implementation is provided in an article entitled "Design of Reflective-Array Surface Wave Devices" published on pages 177-198 of Wave Electronics 2, July 1976, by Melngailis, et al. One technique used to fabricate the grooved reflective array is an ion beam etching process such as described by Martin in U.S. Pat. No. 3,882,429. Proper pulse amplitude equalization or weighting in the frequency domain can be achieved by adjusting the depth of the reflective grooves by ion beam etching, for example, to compensate for energy loss as the acoustic pulse propagates through the array.

In an article entitled "Amplitude Weighting of SAW Reflecting Array-Structures" published on page 390 of the "Proceeding of IEEE Ultrasonics Symposium", 1974, F. G. Marshall, et al describes another method of pulse weighting or equalization in which a form of amplitude weighting called chevron weighting is achieved by employing metallic fingers that can be fabricated by using a single step photo lithographic process instead of the more difficult ion beam etching process. Amplitude weighting is accomplished by progressively scattering more of the acoustic beam out of the transmission path. However, this chevron weighting scheme reflects only part of the aperture of the acoustic wave which introduces phase distortion which in turn limits or reduces the degree of frequency side lobe suppression of the output signal possible for a given RAC. This limiting of the side lobe suppression has deleterious effects in that it reduces the information content of the reflected wave.

It is therefore desirable to provide an acoustic reflective array device which provides pulse amplitude equalization or weighting in the frequency domain without introducing phase distortion of the wave.

SUMMARY OF THE INVENTION

This invention provides an acoustic surface wave device wherein an input electrical signal is converted to an acoustic signal propagating along the surface of a conducting medium toward an array of periodic discontinuities of a material or substance, the reflection coefficient of which, is different from the reflection coefficient of the conducting medium. The effective reflection coefficient of each discontinuity varies as its width. The widths of the discontinuities in the array vary in a predetermined manner such that the amount of the signal reflected varies as the frequency of the signal, i.e., the reflection coefficients vary as a function of the frequency. Thus, by utilizing discontinuities of varied widths, signal amplitude equalization can be achieved across a range of frequencies. A feature of this invention is that the wave front emerging from the reflecting array is uniform and undistorted.

Other features and advantages of this invention will be disclosed by the following exemplary description, taken in connection with the accompanying drawings.

DESCRIPTION OF THE PREFERRED EMBODIMENT

Figure 1:
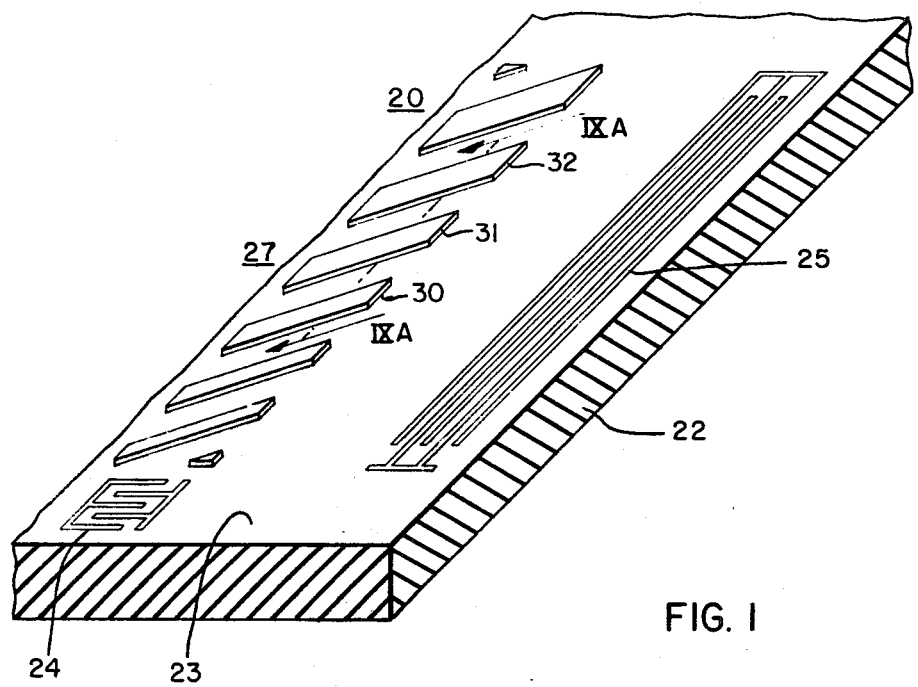
FIGS. 1 and 2 are three-dimensional views of single array acoustic surface wave transmission devices according to one embodiment of the invention. The arrangement of FIG. 1 is for use as a pulse compressor, for example, wherein the widths and the center-to-center spacing of its finger discontinuities increase as a function of the distance of such discontinuities from its input transducer. The arrangement of FIG. 2 is for use as a pulse expander, for example, wherein the widths and the center-to-center spacing of its finger discontinuities decrease as a function of the distance of such discontinuities from its input transducer.
Figure 2:
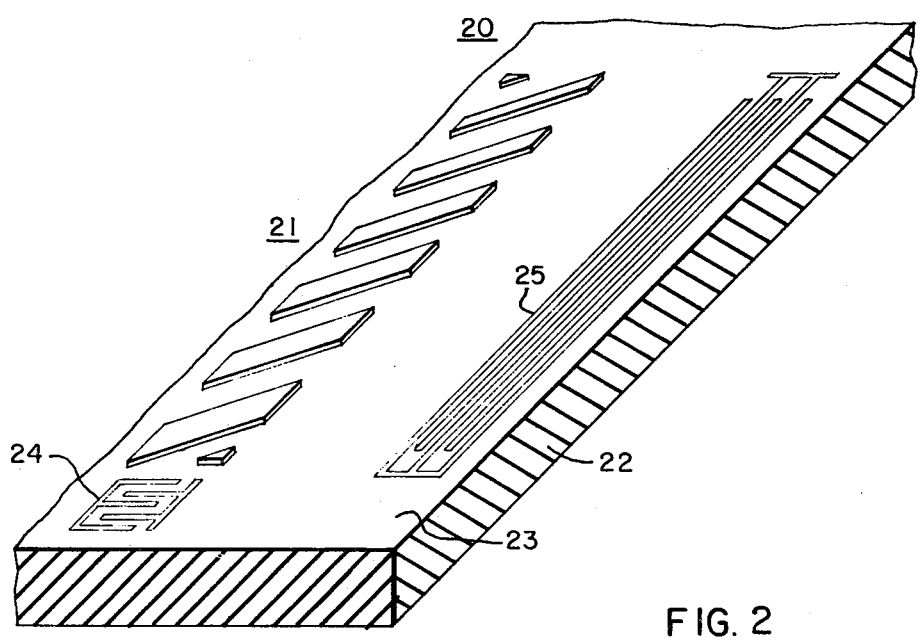
Figure 3:
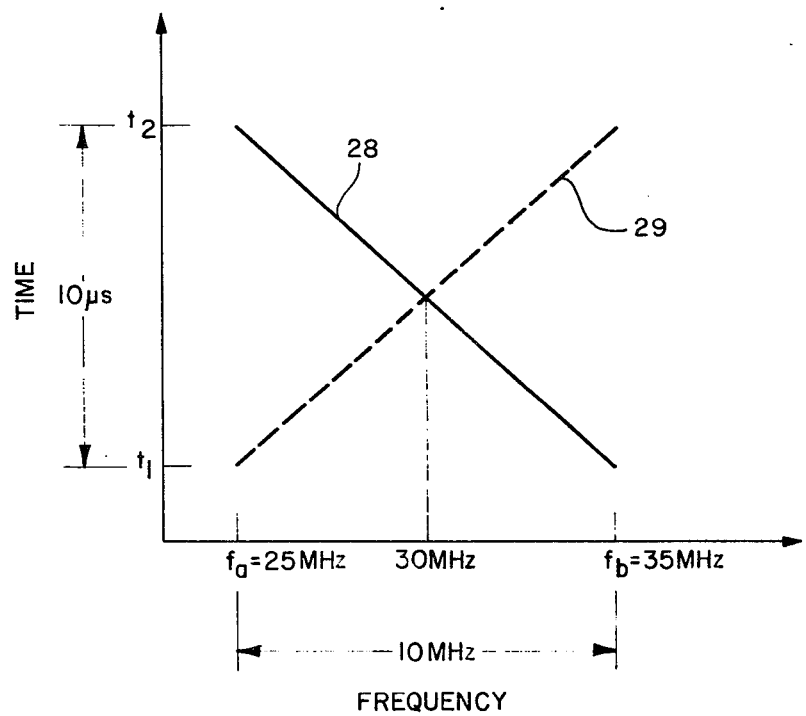
FIG. 3 shows a typical time delay v. frequency graph for use of the present invention as a pulse compressor, for example.

FIG. 1 shows an acoustic surface wave signal transmission device 20 of a configuration having a single array. Device 20 comprises a thin rectangular strip of anisotropic substrate or medium 22, having a surface 23 upon which is formed an input or transmitting transducer 24, an output or receiving transducer 25, and an array or plurality of periodic or spaced discontinuities 27 represented by an array of metallic fingers. The substrate 22 can be any material capable of propagating acoustic energy or waves, such as Y-cut, Z-propagating lithium niobate (LiNbO$_3$), for example. The input transducer 24, the output transducer 25, and the discontinuities array 27 can be formed on surface 23 of the substrate 22 by well-known techniques of depositing metal film, for example, where fingers are employed and ion beam etching, for example, where grooves are used. Discontinuities such as metal fingers may be of any substance or metal, such as aluminum, whose reflection coefficient or impedance characteristic is different from that of the substrate 22. In the embodiment shown in FIG. 1, the fingers of the array 27 increase in width and the center-to-center spacing increases as the distance from the input transducer 24 increases for constant amplitude linear FM generation or response. The effect of the variation in width of the fingers of the array 27 is to provide for selective attenuation of the amplitude of the waves, produced by transducer 24, by the process of phase cancellation. In the embodiment shown in FIG. 2, the fingers of the array 21 decrease in width as the distance from the input transducer 24 increases when the present invention is used for pulse expansion, for example. FIG. 3 shows a graph of typical performance where the device 20 of FIG. 1 is used as a pulse compressor, for example. The ordinate of FIG. 3 represents time delay and the abscissa represents frequency. The dotted curve 29 is a graph of an input signal lauched by the transducer 24 of FIG. 1. The solid curve 28 is a graph of the delay characteristic of the array 27 of FIG. 1. In the graph of FIG. 3, the signal launched by the transducer 24 and represented by the curve 29 typically has a center frequency of 30 MHz and a bandwidth of 10 MHz. The total signal delay due to the array 27 of FIG. 1 and plotted by the curve 28 of FIG. 3 is typically on the order of 10 $\mu$s.

Figure 4:
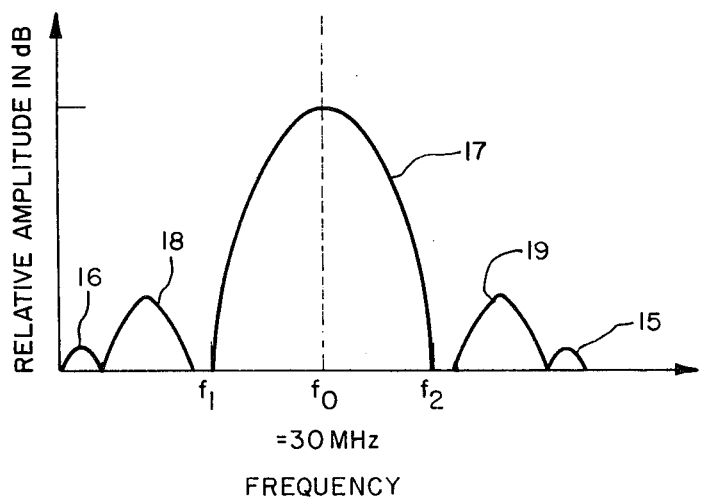
FIG. 4 shows a typical output curve corresponding to the time delay v. frequency graph of FIG. 3.

The output of the transducer 25 of FIG. 1 under the conditions graphed in FIG. 3 by the curves 28 and 29 is a sin x/x function as shown in FIG. 4 having a main lobe with a center frequency of 30 MHz and two sides lobes 18 and 19. More side lobes, for example 15 and 16 exist of lower amplitude stretching out on either side.

Figure 5:
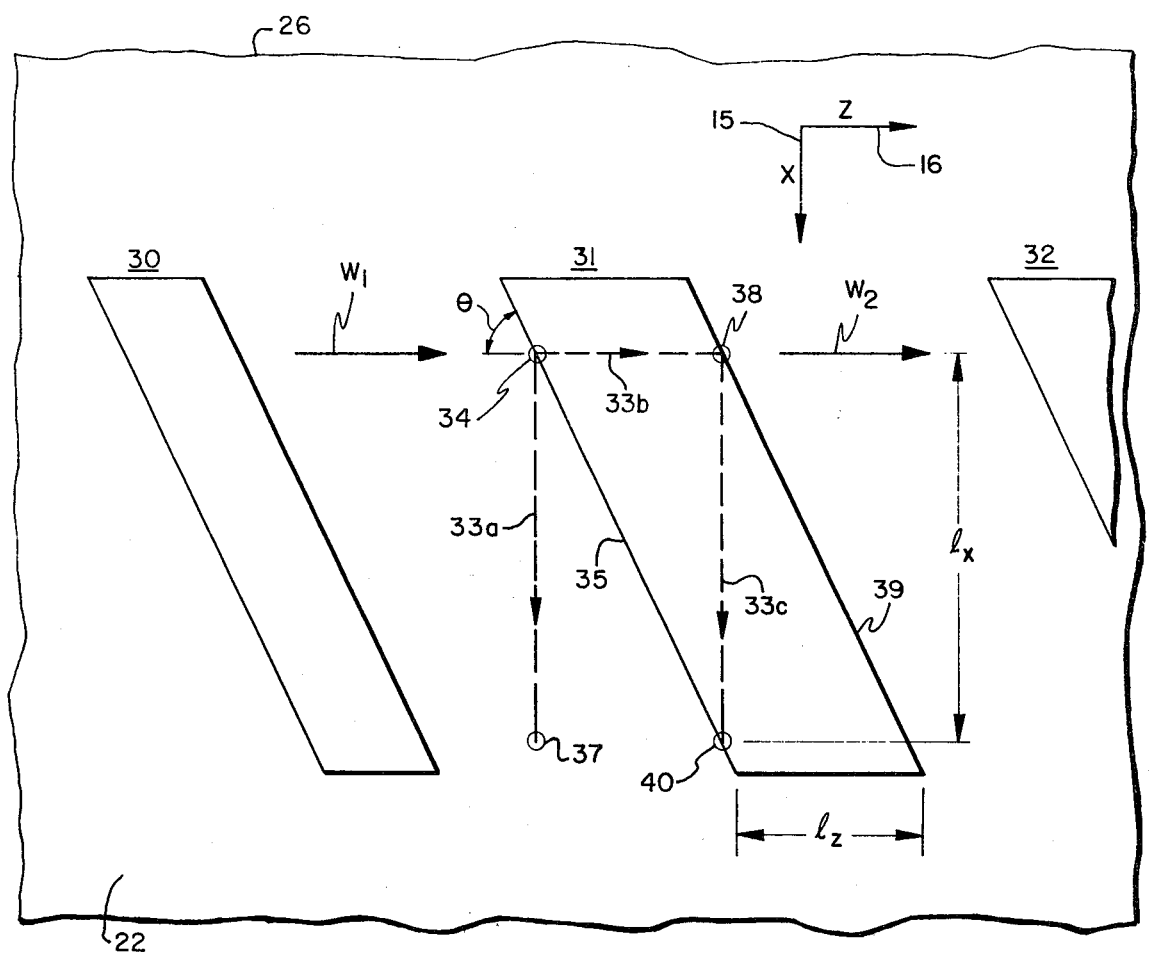
FIG. 5 shows a fragmentary of a portion of the device of FIG. 1.

FIG. 5 is a more detailed view of the portion 26 of device 20 shown in FIG. 1 and is used to illustrate the operation of the present invention. In FIG. 5, a surface acoustic wave represented by the arrow $W_1$ traveling on the substrate 22 and having an amplitude A, leaves first finger 30 and strikes a second finger 31. A portion of the wave $W_1$ represented by the dashed lines at 33a, 33b, and 33c is reflected by the finger 31 and a portion of the wave $W_1$ represented by the arrow $W_2$ continues toward a third finger 32. The wave $W_1$ strikes the finger 31 at an angle of incidence $\theta$ degrees at a first point 34, which is along a front edge 35 of the finger 31. The width of the finger 31 is represented by the term $l_z$. The wave portion 33a of the wave $W_1$ is reflected at the point 34 toward a point 37 on the substrate 22, which point 37 is at a distance represented by the term $l_x$ from the point 34. The wave portion 33b of the wave $W_1$ traverses the width $l_z$ of the metal finger 31. When the wave 33b strikes a back edge 39 of the finger 31 such as at a point 38, for example, the part $W_2$ continues toward the finger 32, the wave portion 33b, is reflected toward a point 40 on the finger 31 which is a distance $l_x$ from the point 38. Thus, the distance $l_x$ is the distance that the wave 33c travels trough the metal finger 31. The discontinuities of the array 27 are generally of uniform width over their entire length. For example, referring to FIG. 5, the edges 35 and 39 are parallel.

When a wave $W_1$ of amplitude A traveling in a non-metallic substrate medium 22 strikes the boundary formed by a non-metallic region and a metallic region such as that represented by the edge 35 in FIG. 5, the amplitude of the wave 33b transmitted through the metal finger 31 is a fraction $\tau$ of the wave $W_1$ amplitude A. Where $\tau$ is the transmission coefficient of the metal finger 31. The amplitude of the wave 33a reflected from the metal is a fraction $\Gamma_d$ of the wave $W_1$ amplitude A. Where $\Gamma_d$ is the reflection coefficient at the point 34 where $\Gamma = \sqrt{(1 - \Gamma_d)^2}$. More particularly, $$\Gamma_d = (z_o - z_m)/(z_o + z_m) \quad (1)$$

where:
$z_o$ = the characteristic impedance of the medium 22;
$z_m$ = the characteristic impedance of the metallic finger 31.

When a wave travels through a metallic region 31 and strikes a boundary 39 formed by the metallic region 31 and a non-metallic substrate medium 22 such as that represented at edge 39 in FIG. 5, the amplitude of the wave 33c reflected is a fraction $\Gamma_u$ of the amplitude A of wave 33b where $\Gamma_u$ is the reflection coefficient at the point 38. Where the non-metallic substrate medium 22 is the same at the rear boundary 39 as it is at the front boundary 35, the relation $\Gamma_d = -\Gamma_u$ exists.

In FIG. 5, the velocity of propagation of the acoustic wave 33a traveling on the substrate in the x direction, can be represented by $V_{xf}$. The velocities of the acoustic wave 33c and 33b traveling through the metal finger 31 in the x and z directions, respectively, can be represented by $V_{xm}$ and $V_{zm}$, respectively. The x and z directions are indicated by the arrows at 15 and 16 respectively. The arrows 15 and 16 are, respectively, parallel and perpendicular to the direction of the wave $W_1$. In an anisotropic substrate, an acoustic wave travels faster in the direction of crystal orientation than when it travels against the crystal orientation. Therefore, the velocity, $V_{zm}$, of the acoustic wave traveling through the metal finger in the z direction will be different from the velocity, $V_{xm}$, of the wave traveling through the metal finger in the x direction. Three relations can be formed:

$$K_{zm} = 2\pi f/V_{zm} = 2\pi/\lambda_{zm} \quad (2)$$

$$K_{xf} = 2\pi f/V_{xf} = 2\pi/\lambda_{xf} \quad (3)$$

$$K_{xm} = 2\pi f/V_{xm} = 2\pi/\lambda_{xm} \quad (4)$$

where f is the frequency of an acoustic wave. Relations such as $K_{zm}$, $K_{xf}$ and $K_{xm}$ are called wave numbers and can be thought of as the number of waves per centimeter. The variables $\lambda_{zm}$, $\lambda_{xf}$ and $\lambda_{xm}$ are the corresponding wavelengths of the waves 33b, 33a, and 33c respectively. The wave number is the reciprocal of the wavelength times $2\pi$.

As an acoustic wave travels through a metallic or non-metallic medium, its phase changes as a function of its velocity, V, through the medium, its frequency, f, and the distance, l, travelled. The phase or amplitude of such a wave is proportional to the function $e^{-ikl}$ where $K = 2\pi f/V$ and $K_1$ is the phase. The function $e^{-ikl}$ can also be expressed as:

$$e^{-ikl} = \cos kl + i \sin kl. \quad (5)$$

In FIG. 5, the reflected wave 33a propagates in the x direction across the substrate from the point 34 at a velocity $V_{xf}$ for a distance $l_x$ to the point 37. The amplitude of the reflected wave 33a at point 37 is $A\Gamma\lambda_d e^{-ik_{xf}l_x}$, where $k_{xf}$ is given in equation (2). A transmitted wave 33b propagates in the z direction across the metal finger 31 from the point 34 at a velocity $V_{zm}$ for a distance $l_z$ to the point 38. The amplitude of this transmitted wave 33b is $A\Gamma$. At the point 38, part of this transmitted wave having an amplitude $A\tau\Gamma_u e^{-ik_{zm}l_z}$, where $k_{zm}$ is given in equation (1), is reflected in the x direction toward the point 40. At the point 40, this reflected transmitted wave has traveled an additional distance $l_x$ and its amplitude then is $A\tau^2{}_u e^{-k_{zm}l_z} e^{-ik_{xm}l_x}$, where $k_{xm}$ is given in equation (4). The total reflection coefficient $\Gamma_{tot}$ of the wave reflected from the finger 31 is the sum of the reflection coefficients at the points 37 and 40, i.e., $$\Gamma_{tot} = \Gamma_d e^{-ik_{xf}l_x} + \tau^2 \Gamma_u e^{-ik_{zm}l_z} e^{-ik_{xm}l_x} \qquad (6)$$

Also, $l_x$ can be expressed as a function of $l_z$:

$$l_x = l_z \tan \theta \qquad (7)$$

Substituting equation (5) into equation (6) illustrates the cyclical nature of the reflection coefficient as it relates to the distance $l_z$ and $l_x$:

$$\Gamma_{tot} = \Gamma_d (\cos k_{xf}l_x + i \sin k_{xf}l_x) + \tau^2 \Gamma_u (\cos k_{zm}l_z + i \sin k_{zm}l_z)(\cos k_{xm}l_x + i \sin k_{xm}l_x) \qquad (8)$$

Figure 6:
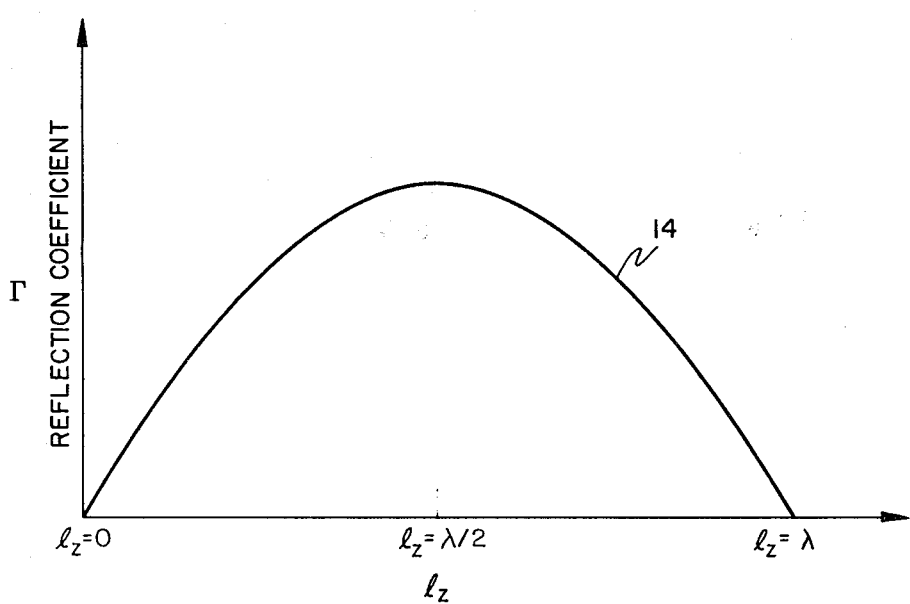
FIG. 6 is a graph which shows how the reflection coefficient of a discontinuity as seen by an acoustic signal of wavelength $\lambda$ varies as the width of the discontinuity.

The curve 14 of the graph of FIG. 6 shows how the reflection coefficient $\Gamma$ varies as a function of the width, $l_z$, of a discontinuity for a wave of wavelength $\lambda$. The curve 14 indicates that the reflection coefficient is a maximum for discontinuities the width of which is $\lambda/2$ and is a minimum for discontinuities the width of which is 0 or $\lambda$.

The amplitude of an acoustic wave of any particular frequency can be weighted, i.e., variably attenuated, by a factor $\Gamma_{tot}$, by choosing the appropriate width $l_z$ of the finger 33. The angle $\theta$ is chosen such that waves striking the points 34 and 38 will be reflected at a 90-degree angle from the original direction of travel. The distance $l_x$ is not a design consideration since from equation (7) $l_x = l_z \tan \theta$. For any particular range of wave frequencies, the variations in widths of fingers or discontinuities in the array 27 can be arranged to effect the desired electrical output. For the configuration illustrated in FIG. 1, the distance between the centers of the fingers is $\lambda$, i.e., for a filter, the wave length of the wave desired to be reflected. For a dispersive device such as a pulse compressor or pulse expander, the distance between the centers of the fingers will vary according to the desired delay characteristics.

It is well known in the electro-acoustic arts that the velocity $V_{zf}$ of an acoustic wave traveling in the direction on a section of Y-cut, Z-propagating lithium niobate crystal is $3.488 \times 10^{-5}$ cm/s and that the velocity $V_{xf}$ of an acoustic wave in the x direction is $3.765 \times 10^{-5}$ cm/s. It can be shown that the velocity $V_{zm}$ of such a wave traveling in the z direction through an aluminum finger deposited on such a crystal is approximately $0.985 V_{zf}$ and that the velocity $V_{xm}$ of the wave in aluminum traveling in the x direction is $0.985 V_{xf}$.

The phase weighting approach as described herein employs fingers which are substantially straight. The wavefront reflected from these fingers is much wider than the wavefront reflected from the shortened fingers in the chevron design with the result that diffraction degeneration of the wavefront is greatly reduced as a function of distance from the reflector. This result allows longer delay lines to be fabricated with less amplitude and phase distortion being introduced as a result of the weighting of the waves.

It should be understood that the embodiment of the present invention illustrated in FIG. 1 is not to be construed to limit the present invention to the illustrated geometric configuration. Consistent with the spirit of the present invention, the principles set forth herein can also be applied to configurations having multiple arrays such as the double array devices shown in FIGS. 7 and 8.

Figure 7:
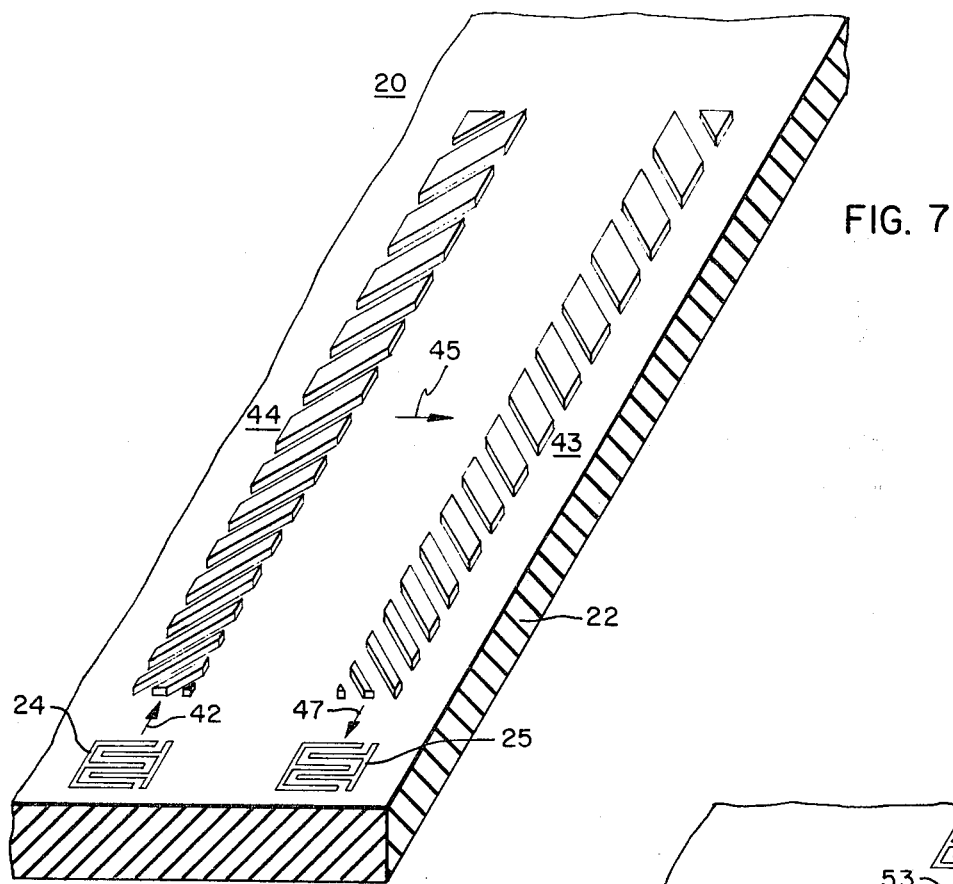
FIGS. 7 and 8 are three-dimensional views of double array acoustic surface wave signal transmission devices according to another embodiment of the invention. The arrangement of FIG. 7 is for use as a pulse compressor, for example, wherein its two arrays are parallel, its two transducers are adjacent, and the widths and the center-to-center spacing of the discontinuities of the two arrays increase as the distance from the transducers. The arrangement of FIG. 8 is for use as a pulse expander, for example, wherein its two arrays are parallel, and its two transducers are opposite each other. The widths and the center-to-center spacing of the discontinuities of its arrays increase as the distance from its input transducer.

Referring to FIG. 7, similar reference numerals are used to refer to like elements referred to in FIG. 1. A surface acoustic wave 42 launched by input transducer 24 toward a first array of fingers 44 is reflected by the array 44 toward a second array of fingers 43. The array 44 consists of fingers, for example, the widths of which increase as the distance from the input transducer 24. The array 43 is a mirror image of the array 44, i.e., the fingers of the array 43 are rotated 90 degrees clockwise in relation to the fingers of the array 44 but opposite fingers are of equal widths. A first reflected acoustic wave 45 propagates toward the array 43 and is in turn reflected by the array 43 toward the output transducer 25. A second reflected acoustic wave 47 emerges from the array 43, is received by the output transducer 25, and converted into a corresponding electrical signal.

Figure 8:
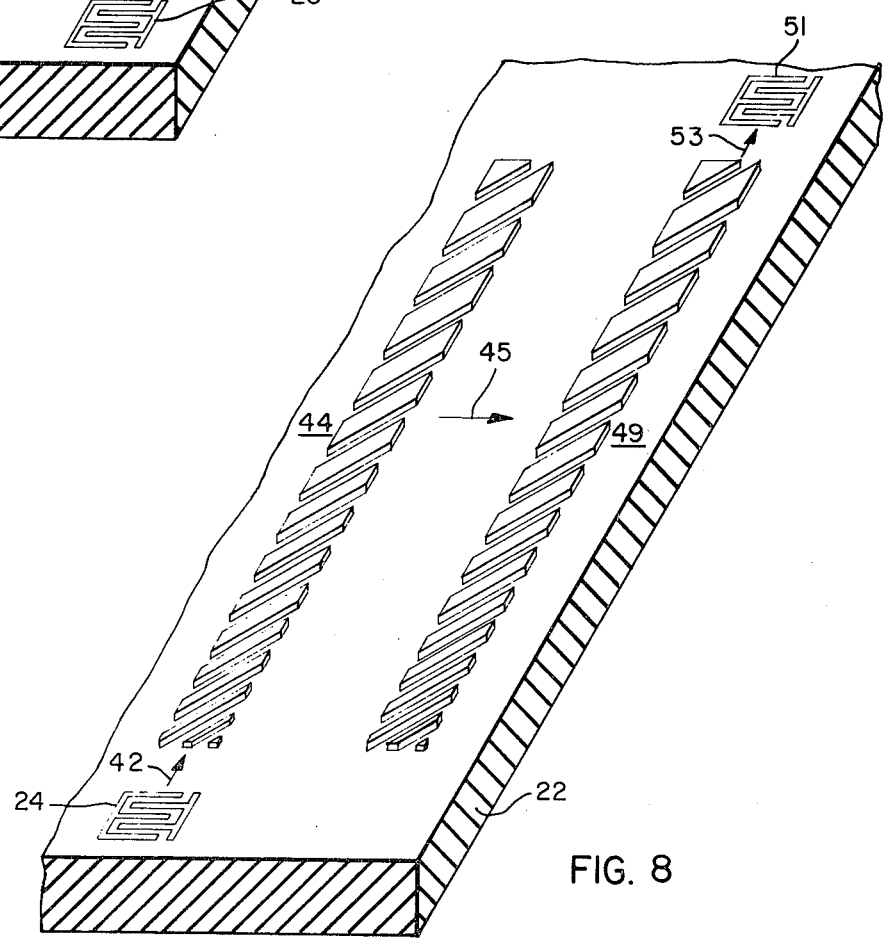

The device of FIG. 8 operates similarly to the device of FIG. 7. Referring to FIG. 7, similar reference numerals are used to refer to like elements referred to in FIGS. 1 and 7. A surface acoustic wave 42 launched by input transducer 24 toward the array 44 is reflected by the array 44 toward an array 49. As in FIG. 7, the array 44 consists of fingers for example, the widths of which increase as the distance from the input transducer 24. The fingers of the array 49, however, have the same angular orientation as the fingers of the array 44. Also, as in FIG. 7, opposite fingers are of equal widths. A first reflected acoustic wave 45 propagates toward array 49 and is reflected in a direction parallel to the direction of launching toward an output transducer 51. A second reflected acoustic wave 53 emerges from the array 49 and is received by the output transducer 51 and converted into a corresponding output signal.

Figure 9A:
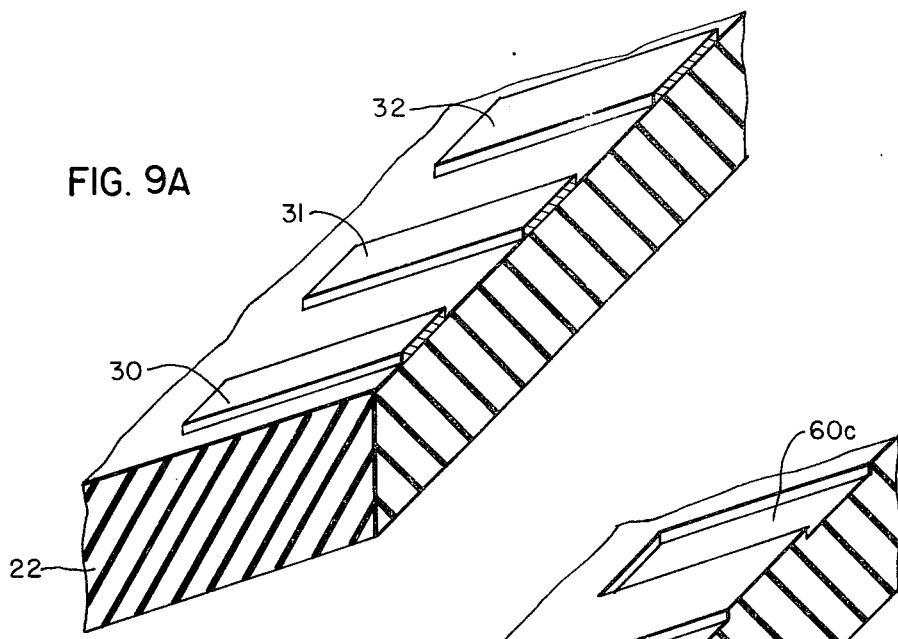
FIG. 9a is a cross-section of deposited finger discontinuities along the lines IXA—IXA of FIG. 1.
Figure 9B:
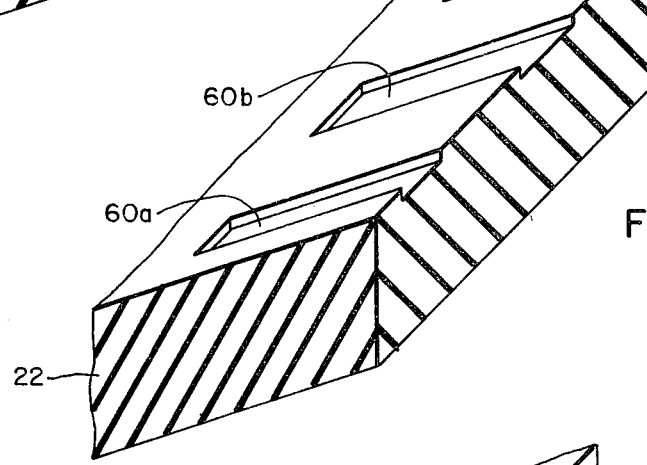
FIGS. 9b and 9c are cross-sections similar to that of FIG. 9a of groove and groove-filled discontinuities, respectively.
Figure 9C:
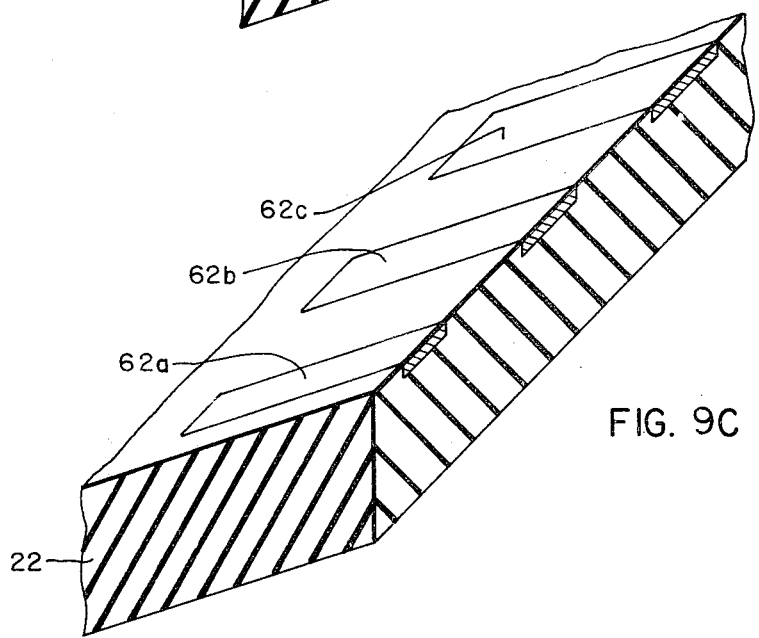

As mentioned hereinbefore, the use of fingers in the array fingers 27 to explain the operation of the present invention is for purposes of illustration only. It is not meant that the scope of the present invention be so restricted or limited. By discontinuity it is meant any area or region encountered by a wave travelling upon medium 22, the characteristic impedance of which is different from that of medium 22. For instance, grooves etched in the surface of medium 22, would result in acoustic waves travelling on the surface of medium 22 encountering a region of air, the characteristic impedance of which is different from that of medium 22. A cross-section of such groove discontinuities are shown, for example, in FIG. 9b wherein the regions of air 60a, 60b, and 60c are the discontinuities. Alternatively, the grooves of FIG. 9b can be filled with a conductive material such as, for example, copper or gold in order to provide a greater impedance mismatch. A cross-section of such filled groove discontinuities are shown, for example, in FIG. 9c wherein the regions of copper 62a, 62b, and 62c are the discontinuities. Other such discontinuities which are within the scope of the principles of the present invention include ion implanted stripes which may vary in width according to the teachings of the present invention.

It is to be noted, also, that the referred to herein is not the free space wavelength, but is the wavelength of the surface wave as it propagates on the surface of the medium 22.

What we claim is:

1. An acoustic wave signal transmission device comprising:
    (a) a medium having a surface suitable for propagating acoustic energy and having a first surface wave impedance characteristic, said surface having a plurality of spaced discontinuities each having a different impedance characteristic from said first surface wave impedance characteristic;
    (b) a transmitting transducer means on the surface of said medium operative in the surface acoustic wave mode for converting an input electrical signal into corresponding acoustic energy and launching said acoustic energy on said medium in a predetermined direction;
    said spaced discontinuities each extending lengthwise across said surface in a direction transverse to said predetermined direction and having varying widths measured in a direction parallel to said predetermined direction for reflecting across said surface a portion of said acoustic energy in proportion to said varying widths;
    (c) a receiving transducer means on said surface of said medium operative in the surface acoustic wave mode for receiving and converting acoustic energy launched by said transmitting transducer means and reflected by said discontinuities into a corresponding electrical signal.

2. Device according to claim 1 wherein said plurality of spaced discontinuities includes a plurality of fingers formed on the surface of said medium.

3. Device according to claim 1 wherein said plurality of spaced discontinuities includes a series of grooves in the surface of said medium.

4. Device according to claim 3 wherein said grooves are filled with a conductive material.

5. Device according to claim 1 wherein said plurality of spaced discontinuities includes ion implanted stripes.

6. Device according to claim 2 wherein said plurality of fingers includes first and second spaced-apart series of fingers positioned on said surface of said medium such that acoustic energy launched by said transmitting transducer means is reflected from said first series of fingers toward said second series of fingers, and is reflected from said second array of fingers toward said receiving transducer means.

7. Device according to claim 1 wherein said medium comprises a thin rectangular strip of lithium niobate.

8. Device according to claim 2 wherein said fingers are aluminum.

9. Device according to claim 1 wherein the widths of said discontinuities increase from a minimum for discontinuities nearest to said transmitting transducer to a maximum for discontinuities farthest from said transmitting transducer.

10. Device according to claim 1 wherein the widths of said discontinuities decrease from a maximum for discontinuities nearest to said transmitting transducer to a minimum for discontinuities farthest from said transmitting transducer.

* * * * *